United States Patent [19]

Paltiel et al.

[11] Patent Number: 4,714,885
[45] Date of Patent: Dec. 22, 1987

[54] MAGNETIC RESONANCE IMAGING

[75] Inventors: Zvi Paltiel, Rehovot; Amir Ban, Tel Aviv, both of Israel

[73] Assignee: Elscint Ltd., Haifa, Israel

[21] Appl. No.: 892,105

[22] Filed: Aug. 4, 1986

[51] Int. Cl.⁴ ............................................. G01R 33/20
[52] U.S. Cl. .................................... 324/312; 324/309
[58] Field of Search ............... 324/307, 309, 312, 314; 128/653

[56] References Cited

U.S. PATENT DOCUMENTS

| | | | |
|---|---|---|---|
| 4,581,582 | 4/1986 | Redington | 324/309 |
| 4,585,993 | 4/1986 | Bottomley | 324/309 |
| 4,628,262 | 12/1986 | Maudsley | 324/307 |

OTHER PUBLICATIONS

Sekihara et al., "A New Method of Measuring Static Field Distribution Using Modified Fourier NMR Imaging", Journal of Physics E; Scientific Instruments, vol. 18, 1985, pp. 224–227.

Dixon, Thomas, "Simple Proton Spectroscopic Imaging", Radiology, Oct. 1984, pp. 189–194.

Primary Examiner—Stewart J. Levy
Assistant Examiner—Kevin D. O'Shea
Attorney, Agent, or Firm—Sandler & Greenblum

[57] ABSTRACT

A method of obtaining a separate data contribution from first and second spectral components during a single magnetic resonance scan. The method uses a scan sequence causing the data from the first and second spectral components to be 90 degrees out of phase. This shift of the data along with a measurement of the inhomogeneities of the field initiates two output signals which are used to provide all of the data required for imaging the two spectral components and/or correcting images for chemical shifts.

9 Claims, 6 Drawing Figures

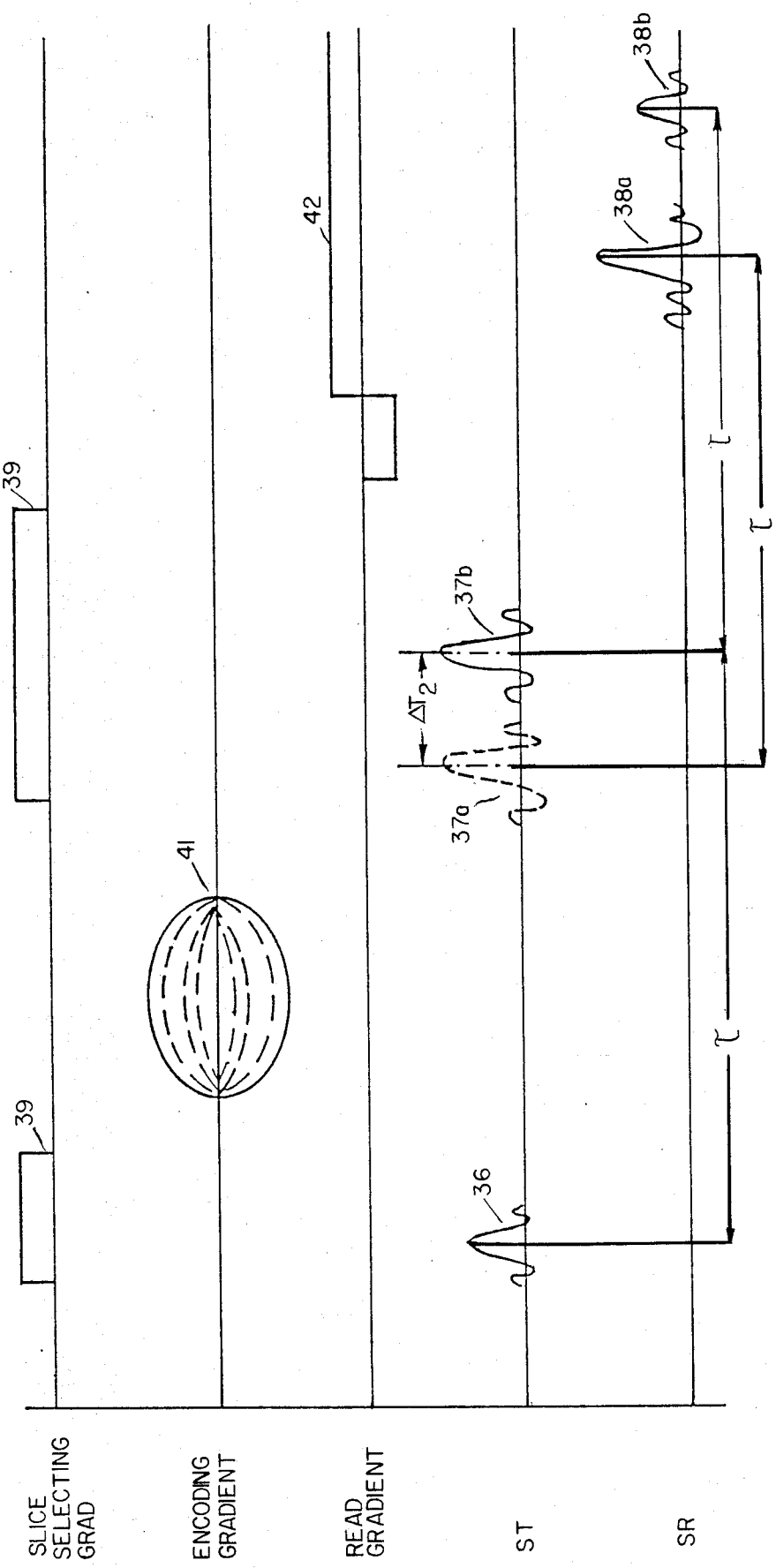

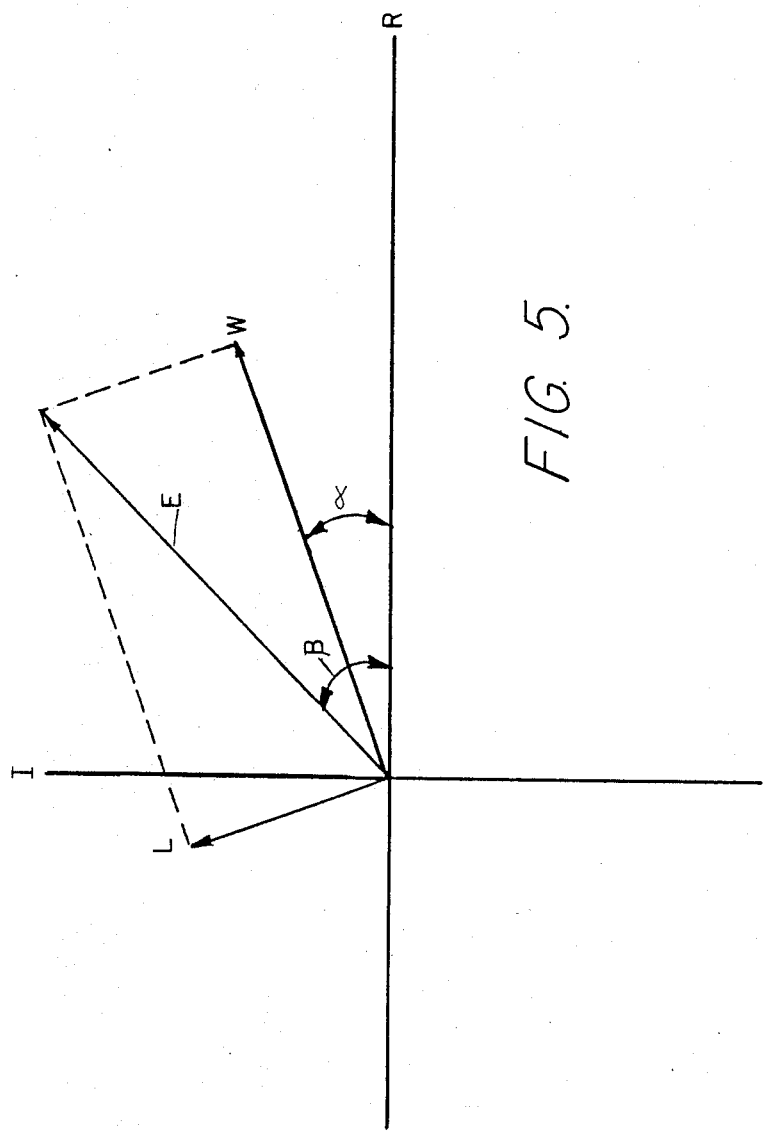

MAGNETIC RESONANCE IMAGING

FIELD OF THE INVENTION

This invention is concerned with magnetic resonance imaging (MRI) systems and more particularly with the use of such systems to obtain separate images of different spectral components such as water and lipids in a sample using a single scan.

BACKGROUND OF THE INVENTION

One of the criteria for imaging systems is the amount of throughput that can be obtained; that is, the number of patients that can be processed and from which complete data can be obtained in a given amount of time. Anything that can be done to increase throughput, that is decrease the time required to obtain data from the patient is a plus as long as the data that is acquired is useful and as long as there is not increased risk of any kind, or increased discomfort to the patient during the scan.

Presently, separate images of two different spectral components such as water and lipids within the patient are sometimes obtained. The separate images are important for diagnostic purposes; since they supply the user with chemical information in addition to the morphological or anatomical information of conventional imaging. Moreover by using an appropriate shift of one image with respect to the other the two images can be combined resulting in an image free of chemical shift artifacts. However, at the present time to obtain the separate images at least two scans of the patient are required; i.e., two imaging cycles such as spin echo cycles have to be processed to obtain the two images.

A unique pair of interelated sequences to obtain information on water and/or lipids in a patient was described in an article appearing in Radiology, entitled "Simple Proton Spectroscopic Imaging" by W. T. Dixon (Vol. 153, pp. 189-194). In that article a method for encoding spectroscopic information into clinical images is explained. The image produced differentiates between the water and fat intensities. The method requires using a normal spin echo sequence in which the Hahn and gradient echoes coincide. In addition each excitation is repeated with the Hahn echo shifted by an appropriate interval. The 180 degree Rf pulse is shifted by a time T to shift the Hahn echo with respect to the gradient echo an amount 2T. The time T is sufficient to cause the chemical shift between the echoes of water and lipids to be 180 degrees out of phase at the gradient echo time. The image produced with the described sequence clearly indicates differences between the signals due to water and the signals due to fat.

By obtaining normal spin echo derived image data in addition to obtaining the modified spin echo image data, the two images can be constructed. Thus, the described method enables imaging two spectral components in a single image corrected for the chemical shift artifact or obtaining separate images of each of two spectral components.

A disadvantage of the described method is the amount of time required for obtaining the data for imaging. More particularly, two scans are required to obtain the two images. Any reduction in this amount of time required to obtain the two images would be advantageous and a sought after goal.

Accordingly it is an object of the present invention to obtain separate data contributions from first and second spectral components sufficient to construct an image for each of the components with a single magnetic resonance scan; thus, cutting the scan time of Dixon by at least one-half.

As used herein scan time is the time required to apply all of the excitation pulses and gradient pulses to enable acquiring sufficient data to construct an image of a selected volume of a sample being imaged. A single scan is the minimal Rf signal transmitting and receiving repetitions required to acquire the data for an image of a single spectral component having the desired spatial resolution and signal-to-noise ratio.

BRIEF DESCRIPTION OF THE INVENTION

A method of obtaining separate data contributions derived from first and second spectral components for images of selected portions of samples in a single magnetic resonance imaging (MRI) scan is provided, said images comprised of pixels corresponding to spatially defined sections in the selected portions of the samples, said method comprising the steps of:

acquiring Rf signals using a scan process that generates spin echoes in a single MRI scan, said Rf signals each compared of combination echoes, the combination echoes including data contributions from the first and second spectral components, causing desired phase differences between the data contributions of the spectral components, processing the acquired Rf signals to determine the separate data contributions of said spectral components in each of the spatially defined sections, and calculating the separate contributions of each of the spectral components for each pixel based on the contribution in each of the corresponding spatially defined sectors.

A feature of the invention includes using scans comprised of Hahn echo and gradient echo scans to acquire the spin echo data.

A further feature of the invention comprises displaying separate images of the first and second spectral components using each of the separate contributions of the first and second spectral components in pixels corresponding to each of the spatially defined sections.

Another feature of the invention is the use of the method with the first and second spectral components being a lipid and water respectively.

Yet another feature of the invention includes positioning the 180 degree Rf pulse to cause a 90 degree phase difference between the data contributions of the first and second spectral components.

A further feature of the invention positions the 180 degree Rf pulse to cause a phase difference between the first and second spectral components that is not equal to 90 degrees.

Still another feature of the invention derives determinants from the data contributions for determining the separate data contributions of each of the spectral components.

BRIEF DESCRIPTION OF THE DRAWINGS

The above objects and features of the present invention will be best understood when considered in the light of the following description of a broad aspect of the invention taken in conjunction with the accompanying drawings, wherein:

FIG. 4 is a showing of an inventive data acquisition sequence as described herein for obtaining imaging data on two spectral components in a single scan; and FIG. 5 is a vector showing of results obtained using the sequence of FIG. 4.

GENERAL DESCRIPTION

Figure 1:
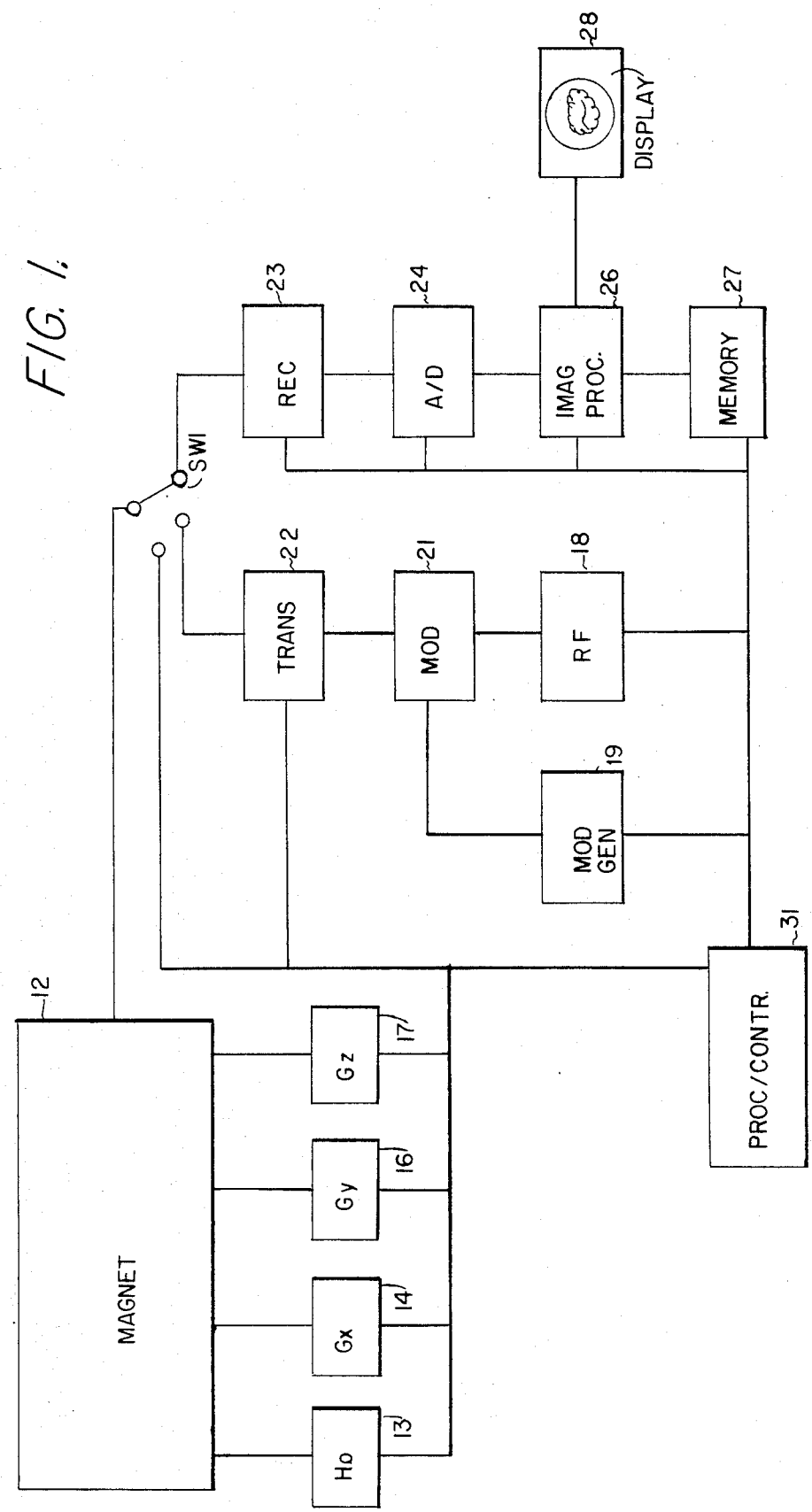
FIG. 1 is a typical MR data acquisition system.

FIG. 1 generally shows an MRI system 11 for use in acquiring data and providing images using magnetic resonant principles. The system includes a large static magnet 12 into which the patient (or sample) is placed. The static field can be generated using electro-magnets, permanent magnets or superconducting magnets within the scope of this invention. In a preferred embodiment, a superconducting magnet is used. The energization of the superconducting magnet is indicated at 13 by the magnetic field generating block Ho.

Means are provided for locating the source of signals received. More particularly gradient fields are applied to the static magnetic field. These gradients are applied in the recognized X, Y, and Z cartesian coordinates that are standard in MRI systems. Gradient generators are indicated at blocks 14, 16 and 17 labelled Gx, Gy and Gz respectively. The gradients are used to vary the magnetic fields along the X, Y, and Z axes and thus provide slice selection, encoding and view selection functions.

The large static magnetic field causes an alignment of certain nuclear spins in the sample (or patient). Means are provided subsequently for nutating the aligned spins by applying radio frequency pulses at the Larmor frequency of the particular nuclei being nutated. The Larmor frequency is:

$$fl = \gamma Bo/2\pi$$

where: $\gamma$ is the gyromagnetic constant for the isotope whose nuclei is nutated $\pi$, is the constant 3.1416 and Bo is the strength of the static field at the location of the nuclei.

The radio frequency pulse is generated in the Rf generator 18 The signal may be shaped by modulating it with a shaped signal generated at modulation signal generator 19. The shaped signals and the Rf signals are applied to the modulator 21. The modulated shaped Rf signal is then transmitted by the transmitter amplifier 22 through switch SW 1 to Rf coils in the main magnet assembly 12. It should be understood that for purposes of this invention it is not necessary to shape the Rf signals.

In echo producing sequences, after the passage of set amount of time from the end of the Rf pulse, echo signals are generated. The echo signals may be Hahn echo and gradient echo signals or just gradient echo signals with appropriate phase differences between the spectral components. The echoes are received by the receiver 23 using either the same radio frequency coils used during transmission or using separate Rf pick-up coils. In either case, the received signals are digitized by the A/D circuitry indicated at 24, and amplified by the amplifier 26. The amplified digitized signals may be processed in conjunction with memory means 27 to obtain images for display on the monitor 28.

The acquisition, processing and imaging operations are under the control of the processor controller 31. The processor controller 31 provides the control signals and times for the particular scan sequences used in acquiring data.

When acquiring data for images using protons for example, artifacts are often generated because of what are known as chemical shifts. The chemical shifts are caused by the differences in the resonant frequencies of the hydrogen nuclei attached to different molecules. For example hydrogen attached in a water molecule has a slightly different Larmor frequency than hydrogen in a lipid. The differences in frequencies produce actual spatial shifts which cause artifacts in the image. The chemical shift causes artifacts in the images however, the chemical shift can also be used to obtain additional data, such as for example, data which quantifies the amount of fatty substances in body tissues.

Figure 2:
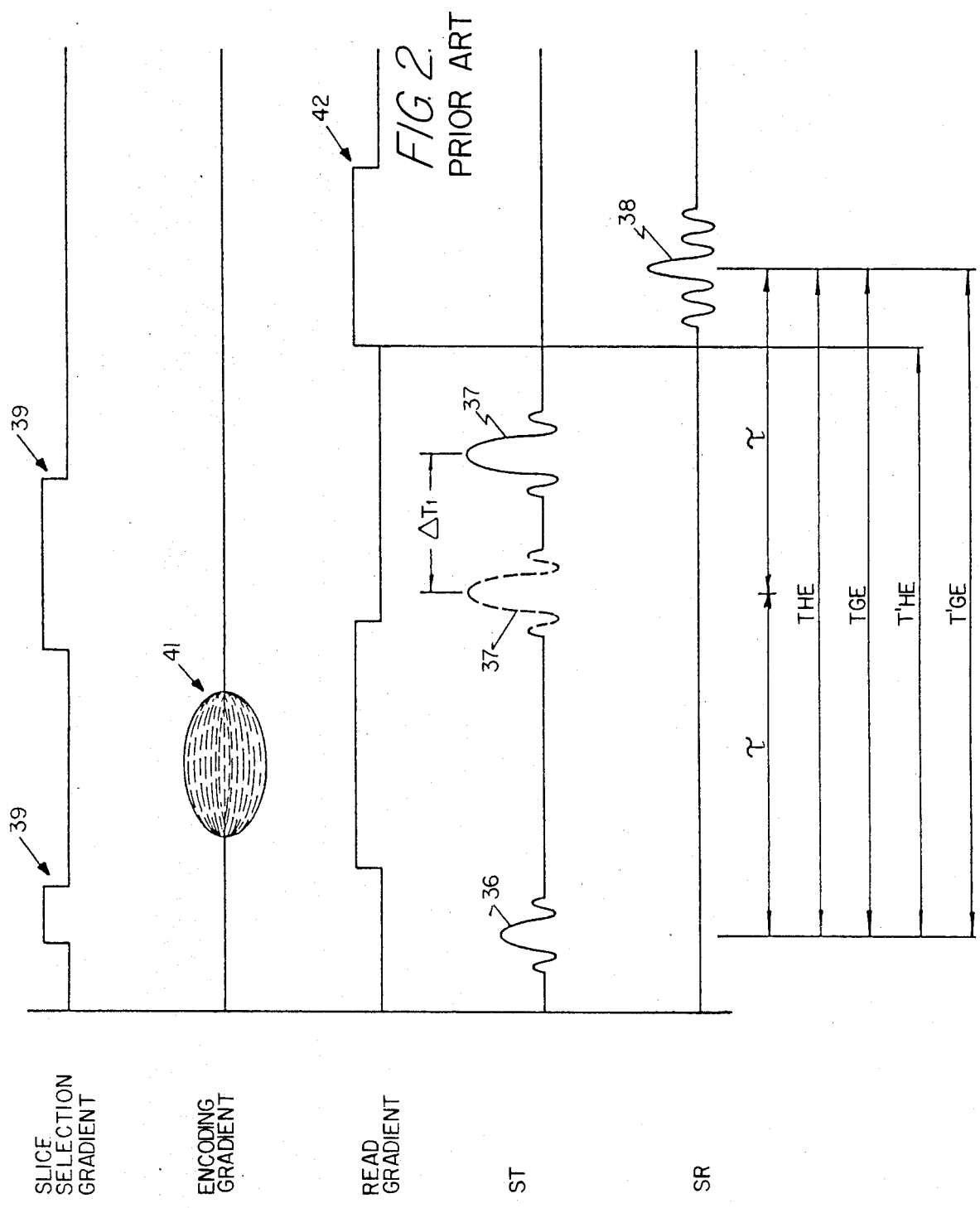
FIG. 2 is a showing of the Dixon data acquisition sequence for obtaining imaging data on water and lipids.

As described hereinbefore the chemical shift has been used to obtain images showing differences between water fat. Also by using two scans as described by Dixon separate images may be acquired of the water and the fatty substances. The Dixon spin echo scan sequence for such imaging is shown in FIG. 2, as an example. In the Dixon spin echo sequence, a 90 degree Rf pulse 36 is transmitted to nutate the aligned spins 90 degrees.

Subsequently, after a defined amount of time another Rf pulse 37 is transmitted which is of sufficient strength or duration to nutate the already nutated spins 180 degrees. After a time equal to the time period between the 90 degree pulse and the 180 degree pulse, echo signals such as echo signal 38 occurs and is received by the system. The echo signals are used in the spin echo sequence for imaging purposes. The gradient pulse i.e. the slice selection gradient 39, the encoding gradient 41 and the view (read-out) gradient 42 are used to spatially locate the source of the echoes. It should be understood that the term "180 degree pulse" includes pulses which shift the nutated spins to have a component shifted 180 degrees.

It is known that an echo can also be obtained without the 180 degree Rf pulse if a proper view gradient is applied. In fact, in any normal MRI sequence, echoes called gradient echoes appear. Generally, in the spin echo sequence both Hahn and gradient echoes are combined. A 180 degree Rf pulse is applied and the view gradient pulse is used to "focus" the echo. That is, the 180 degree Rf pulse and the view gradient pulse are timed in order to obtain a larger more defined combined echo pulse.

As Dixon explains the 180 degree Rf pulse is shifted an amount T1Δ sufficient so that the received echo pulses from the water protons are a 180 degree out of phase with the echo pulses received from lipid protons at the time of the gradient echo. More particularly, the time T1Δ shown in FIG. 2 is 1/(4 v); where v is the chemical frequency shift between the fat and water in Hz. The result is that at the peak of the gradient echo, the signal contributions of the two spectral components are 180 degrees out of phase.

Using the equipment of FIG. 1 for example, the Dixon method requires two scans to obtain sufficient data to provide water and lipid images. A first scan is run to obtain echoes without shifting the 180 degrees Rf pulse. In a second scan Dixon shifts the 180 degree Rf pulse an amount T1Δ so that echo signals are obtained which are made up of echo signals from both the water spins and the lipid spins which are 180 degrees out of phase with each other at the time of the gradient echo.

Figure 3:
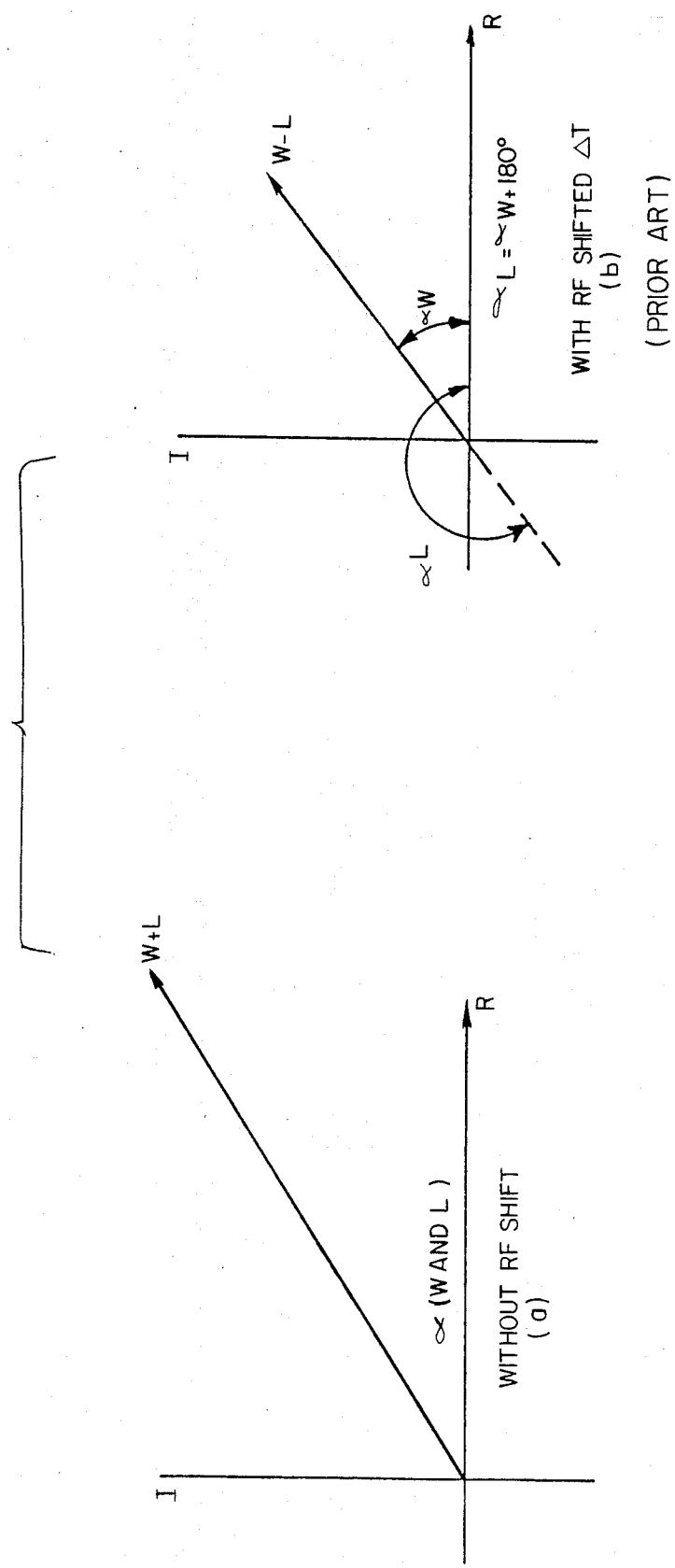
FIGS. 3a and 3b are vector showings of results obtained using the Dixon sequence of FIG. 2 for obtaining data.

As shown in FIG. 3 the water components and the lipid components are either in phase as shown in FIG. 3a which represents the first scan described above, or out of phase as shown in FIG. 3b which represents the second scan described above. The regular processing of the acquired signals (e.g. by Fourier Transformation) separates the contributions for each of the volume elements whereby the discrete processed signals at each point (pixel) are complex numbers proportional to the sum of that volume element's water and lipids complex contributions. Therefore adding the data of both received signals (i.e. (W+L)+(W−L)) provides water's contributions to each volume element. Subtracting the two signals (i.e. (W+L)−(W−L)) provides the lipids' contribution to each volume element.

FIG. 4 shows a sequence similar to that of FIG. 2 but wherein data from both first and second spectral components can be obtained and distinguished in one scan. This is done by shifting the 180 degrees Rf transmitted pulse an amount ΔT2=1/(8 v).

The result is a first spectral component W (water for example) responsive echo signal that is 90 degree removed from the second spectral component L (lipids for example) responsive echo signal at the peak of the gradient echo. By separating the contributions of the spectral components by 90 degrees the contributions of the spectral components can be aligned with the real and imaginary components of the complex numbers.

Vectors representing the received echoes are shown in FIG. 5. The echo's water contribution is shown removed from the real axis by α degrees. The resultant echo due to the contribution of lipid and of water is shown as the vector E removed from the real axis by an angle β. The data can be described as having real and imaginary components, i.e.

$$SW = E \cos(\beta - \alpha) \quad (1)$$

$$SL = E \sin(\beta - \alpha) \quad (2)$$

$$TAN \beta = SL/SW \quad (3)$$

$$E = (SW2 + SL2)^{\frac{1}{2}} \quad (4)$$

where:
SW is the measured water contribution to the echo,
SL is the measured lipid contribution to the echo,
E is the computed resultant echo signal,
β is the angle between a resultant echo (E) and the real axis
β−α is the angle between the water and the resultant echo
α is the angle between the measured water contribution and the real axis.

The angle is a function of instrumental components and field inhomogeneities. If the field were completely homogeneous the angle would be a constant. Since the inhomogenieties of the static magnetic field are spatially dependent, both the real component (the water data) and the imaginary component (the lipid data) have to be multiplied by a spatial function to obtain the proper data for imaging of the water contribution and lipid contribution. The spatial function is the angle determined by measurements on a water phantom, for example, on a per pixel basis and used to determine the phase shift of the first of said two spectral components from the axis in a Fourier plane.

The premeasured values of α are used to separate the contributions of the two chemical components, such as water and lipids, using the equations (1)–(4) above. Other alternatives are available with the data obtained as explained herein. For example, the complex signal E eβ of each volume element can be multiplied by e−iα. The first component (water) can be taken as the real part and the second component (lipid) as the imaginary part for each volume element.

Thus in operation, an echo sequence is run with ΔT2, i.e. the time for transmitting the 180 degree pulses being less than the time τ by 1/(8 v). This provides two echoes representing water and lipids separated by 90 degrees. The angle α due to inhomogenieties is measured prior to testing. The knowledge of the quantities W, Lα, and β enable computing the quantities E, SW, SL and ; which in turn, among other things, enables providing two separate images one of lipid and one of water using a single scan.

Accordingly, a unique imaging data acquisition method is provided herein. The method enables the acquisition of data in a single scan which can be used for separate imaging of two spectral components and/or correcting and reducing the chemical shift artifacts.

While the invention is discussed with regard to specific examples it should be understood that these examples are not given as limitations on the scope of the invention but merely as exemplary embodiments of the invention.

What is claimed is:

1. A method of magnetic resonance imaging for obtaining data contributions of first and second spectral components from a subject using a single magnetic resonance scan, said method comprising the steps of:
    (a) using a scan sequence that separates echo signals from said first and second spectral components by 90 degrees and provides a resultant echo signal and the phase angle β between the resultant echo signals and a horizontal axis of a cartesian co-ordinate system;
    (b) determining the angle α between the horizontal axis and the echo signal of said first spectral component; and
    (c) subtracting the angle α from the angle β to rotate the resultant echo signals so that the first and second spectral components align with the horizontal and vertical axes of the cartesian co-ordinate system respectively.

2. The method of claim 1 wherein the scan sequence comprises a combination of a Hahn echo sequence and a gradient echo sequence.

3. The method in MR imaging of claim 1 wherein said scan sequence comprises inserting a subject in a strong static magnetic field,
applying a first radio frequency pulse for nutating spins,
applying a second radio frequency pulse at a time τ−ΔT removed from the first radio frequency pulse, said second radio frequency pulse shifting the already nutated spins 180 degrees, where delta T is equal to 1/(8 v) and v is equal to the difference in Lamor frequences of said first and second spectral components, applying encoding gradient pulses, between said first radio frequency pulse and said second radio frequency pulses, applying a read gradient pulse encompassing the time $2\tau$ after the application of the first radio frequency pulse, and receiving a pair of radio frequency echo signals said first radio echo frequency signal being determinative of the data for said first spectral component, said second radio frequency signal being determinative of said second spectral component, said first and second radio frequency signals being separated by 90 degrees.

4. The method of claim 1 wherein said first spectral component is water and the second spectral component is a lipid.

5. A method in MR imaging for obtaining the data contribution from first and second spectral components during a single magnetic resonance scan, said method comprising the steps of:

using a gradient echo sequence that provides echo signals from said first and second spectral components that are received at a first time, using a Hahn echo sequence that provides echo signal from said first and second spectral components that are received at a second time, said time difference between said first time and said second time controlled to be $\frac{1}{8}$ v, where v is the chemical shift between the first and second spectral components.

6. The method of claim 5 wherein said first and second spectral components are water and lipids.

7. A method of obtaining separate data contributions for magnetic resonance images is provided, said contributions derived from first and second spectral components in a single magnetic resonance imaging (MRI) scan, said images comprised of pixels corresponding to spatially defined sections in the selected portions of the samples, said method comprising the steps of:

acquiring output Rf signals from a sample by using an echo scan sequence wherein said Rf output signals may be each comprised of combination signals including contributions from both the first and second spectral components, said scan sequence causing phase difference between the data contributions from the first and second spectral components, processing the acquired output Rf signals to determine the contribution to the output Rf signals of each of the spectral components at each of said spatially defined sections; the said contributions comprising determinants for determining the separate portions of each of the spectral components, and said processing step including the step of calculating the separate contributions of each of the spectral components for each pixel based on the contribution in each of the corresponding spatially defined sections.

8. A method of obtaining data contributions of two spectral components in a single magnetic resonance scan, said method comprising the steps of:

(a) acquiring data of a sample using a gradient echo scan sequence simultaneously with a Hahn echo scan sequence to thereby obtain a Hahn echo and a gradient echo;

(b) shifting the Hahn echo with respect to the gradient echoes to obtain a 90 degrees phase separation between the data from said two spectral components;

(c) measuring the resultant echo comprised of the Hahn echo and the gradient echo and the phase angle between the resultant echo and the horizontal as a spatially dependent function;

(d) determining the Fourier transform of the measured resultant echo;

(e) determining the phase shift of the first of said two spectral components from the real axis in a Fourier plane;

(f) determining the phase shift of the resultant echo from the real axis in the Fourier plane; and (g) determining the contributions of each of the spectral components using the phase shift of the first of said two spectral components from the real axis in the Fourier plane and the phase shift of the resultant echo from the real axis of the Fourier plane to determine the phase shift between the first of said two spectral components from the resultant echo.

9. The method of claim 8 wherein said first and second spectral components are water and lipids.

* * * * *